United States Patent
Andersen et al.

(10) Patent No.: US 6,804,132 B2
(45) Date of Patent: Oct. 12, 2004

(54) CIRCUIT FOR MULTIPLE MATCH HIT CAM READOUT

(75) Inventors: William R. Andersen, Milton, VT (US); Joseph H. Heinrich, Chester, NH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,838

(22) Filed: Nov. 25, 2002

(65) Prior Publication Data

US 2004/0100809 A1 May 27, 2004

(51) Int. Cl.[7] .............................................. G11C 15/00
(52) U.S. Cl. ...................................... 365/49; 365/239
(58) Field of Search ..................... 365/49, 239, 230.06, 365/154

(56) References Cited

U.S. PATENT DOCUMENTS

| | | | |
|---|---|---|---|
| 3,602,899 A | 8/1971 | Lindquist et al. | 340/172.5 |
| 4,670,858 A | 6/1987 | Almy | 365/49 |
| 4,928,260 A | 5/1990 | Chuang et al. | 365/49 |
| 5,396,448 A | 3/1995 | Takayanagi et al. | 365/49 |
| 5,406,508 A | 4/1995 | Hayashibara | 365/49 |
| 5,495,382 A | 2/1996 | Albon | 365/49 |
| 5,649,149 A | 7/1997 | Stormon et al. | 395/435 |
| 5,852,569 A | 12/1998 | Srinivasan et al. | 365/49 |
| 6,118,682 A | 9/2000 | Martin | 365/49 |
| 6,157,558 A * | 12/2000 | Wong | 365/49 |
| 6,175,513 B1 | 1/2001 | Khanna | 365/49 |
| 6,181,592 B1 | 1/2001 | Aoki | 365/49 |
| 6,181,698 B1 | 1/2001 | Hariguchi | 370/392 |
| 6,307,798 B1 | 10/2001 | Ahmed et al. | 365/207 |
| 6,418,042 B1 * | 7/2002 | Srinivasan et al. | 365/49 |
| 2003/0033326 A1 * | 2/2003 | Kumar et al. | 707/202 |
| 2003/0145178 A1 * | 7/2003 | Jiang et al. | 711/158 |

FOREIGN PATENT DOCUMENTS

WO    WO 98/53458    11/1998

OTHER PUBLICATIONS

IBM Technical Disclosure Bulletin, E.E. Davidson, vol. 17, No. 3, "Encoder/Resolver Array for Content Addressable Memory", Aug. 1974, pp. 855–858.
IBM Technical Disclosure Bulletin, vol. 34, No. 2, "Addressed Writeable and Associative Readable Memory", Jul. 1991, pp. 326–329.

* cited by examiner

Primary Examiner—Thong Le
(74) Attorney, Agent, or Firm—Robert A. Walsh; Hoffman, Warnick & D'Alessandro LLC

(57) ABSTRACT

An apparatus for reading out multiple match hits from a content addressable memory (CAM), comprising a priority encoder for receiving a plurality of matchlines from a CAM and for encoding addresses of the CAM that are associated with the matchlines that indicate a match, and a matchline mask system for selectively masking off a matchline that indicates a match from the priority encoder after the address associated with that matchline is encoded by the priority encoder.

19 Claims, 2 Drawing Sheets

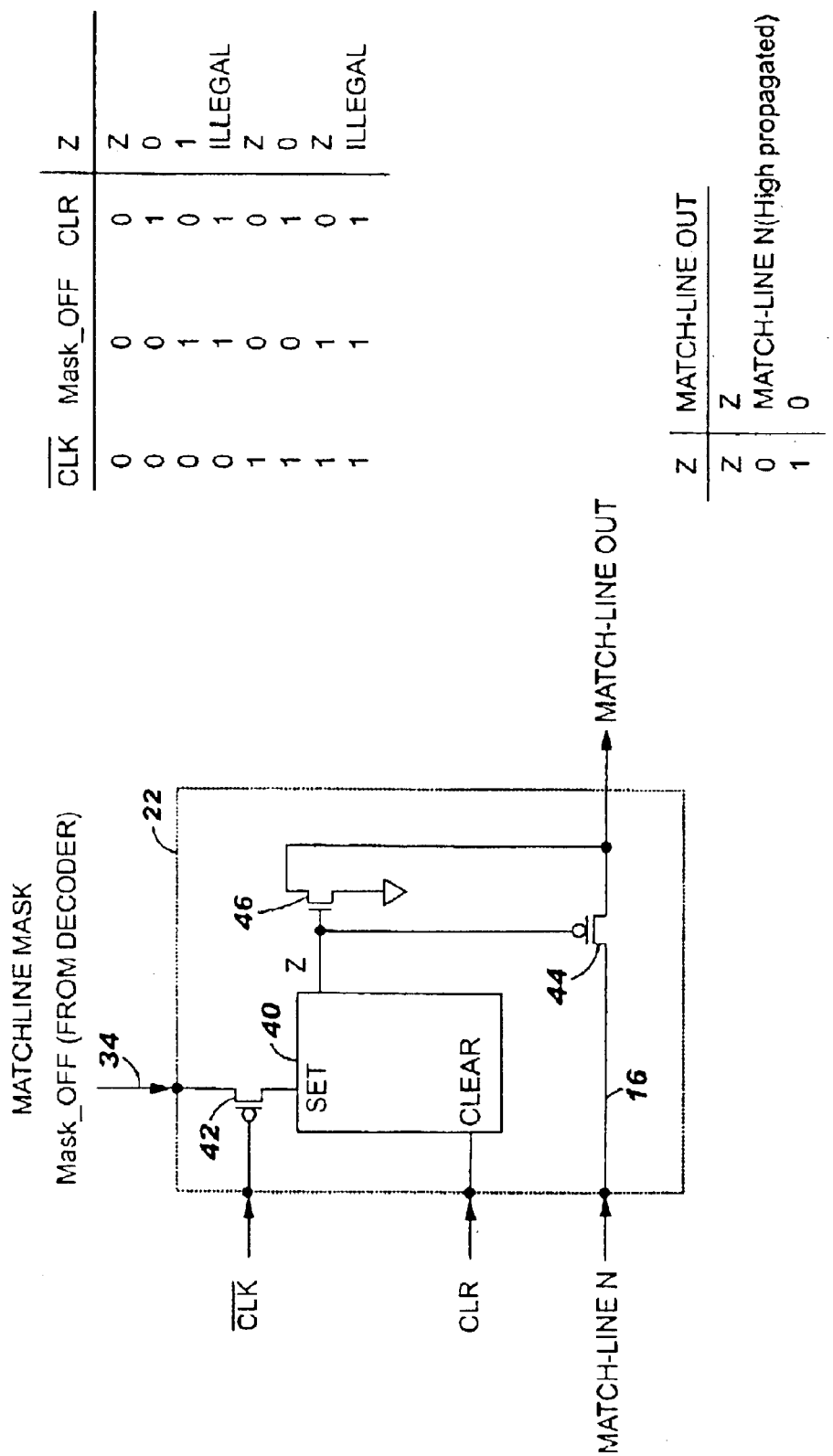

CIRCUIT FOR MULTIPLE MATCH HIT CAM READOUT

BACKGROUND OF THE INVENTION

1. Technical Field

The present invention relates in general to content addressable memory (CAM), and more particularly, to a circuit for reading out multiple match hits from a CAM.

2. Background Art

A content addressable memory (CAM) includes an array of memory cells arranged in a matrix of rows and columns. Each memory cell stores a single bit of digital information. The bits stored in a row of memory cells in the CAM constitute a CAM word. During compare (i.e., "search") operations, a comparand word is received at appropriate input terminals of the CAM and then simultaneously compared in parallel to all the CAM words in the CAM. If the comparand word matches one of the CAM words (i.e., a matchline "hit" occurs), a matchline corresponding to the matching CAM word is asserted to indicate a match condition. If the comparand word matches more than one of the CAM words, the matchline corresponding to each of the matching CAM words is asserted, and a "multiple match" flag is asserted to indicate the multiple match condition.

The asserted matchline(s) are prioritized in a predetermined manner and subsequently decoded into their corresponding CAM addresses using a priority encoder. When multiple matches are present, the time required to examine and encode all of the addresses corresponding to the asserted matchlines is dependent upon the minimum cycle time between address reads. In particular, the greater the minimum cycle time, the longer it takes the priority encoder to encode all of the addresses corresponding to the asserted matchlines.

An example of a system for reading multiple matched addresses is disclosed in U.S. Pat. No. 6,118,682 to Martin, which is incorporated herein by reference. In Martin, the signal level of every matchline of the CAM must be tested in succession with the addition of a gate delay, whether matching or not. The minimum cycle time in this system is limited by the AND gate delay of a signal rippling through a plurality of AND gates (see, e.g., AND gates 26, 28, 30, . . . , FIG. 1 of Martin). Since, for each matchline of the CAM, another AND gate is required, the minimum cycle time increases dramatically as the size of the CAM increases. In particular, the minimum cycle time in Martin is given by:

min_cycle=gate delay*#of matchlines.

As an example, for a 16-word CAM, the minimum cycle time (gate delays) is 16, while for a 1024-word CAM, the minimum cycle time (gate delays) is 1024.

As a result, there exists a need for a circuit for reading out multiple match hits from a CAM in a more time efficient manner. In particular, there exists a need for a circuit for reading out multiple match hits from a CAM that reduces the minimum cycle time between address reads.

SUMMARY OF THE INVENTION

A first aspect of the invention provides an apparatus for reading out multiple match hits from a content addressable memory (CAM), comprising a priority encoder for receiving a plurality of matchlines from a CAM and for encoding addresses of the CAM that are associated with the matchlines that indicate a match, and a matchline mask system for selectively masking off a matchline that indicates a match from the priority encoder after the address associated with that matchline is encoded by the priority encoder.

A second aspect of the invention provides an apparatus for masking matchlines of a content addressable memory (CAM), comprising a plurality of matchline mask units, wherein each matchline of the CAM passes through a respective one of the matchline mask units, and wherein each matchline mask unit is configured to mask its associated matchline from a priority encoder, and a decoder system for sequentially masking each matchline that indicates a match from the priority encoder using the matchline's respective matchline mask unit.

A third aspect of the invention provides a method for reading out multiple match hits from a content addressable memory (CAM), comprising receiving a plurality of matchlines from a CAM, determining and prioritizing the matchlines that indicate a match, sequentially encoding the addresses of the CAM that are associated with the matchlines that indicate a match, and selectively masking off a matchline that indicates a match after the address associated with that matchline has been encoded.

The exemplary aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which:

FIG. 2 illustrates a matchline mask unit that may be used in the multiple match hit readout circuit of FIG. 1, in accordance with the present invention.

Figure 1:
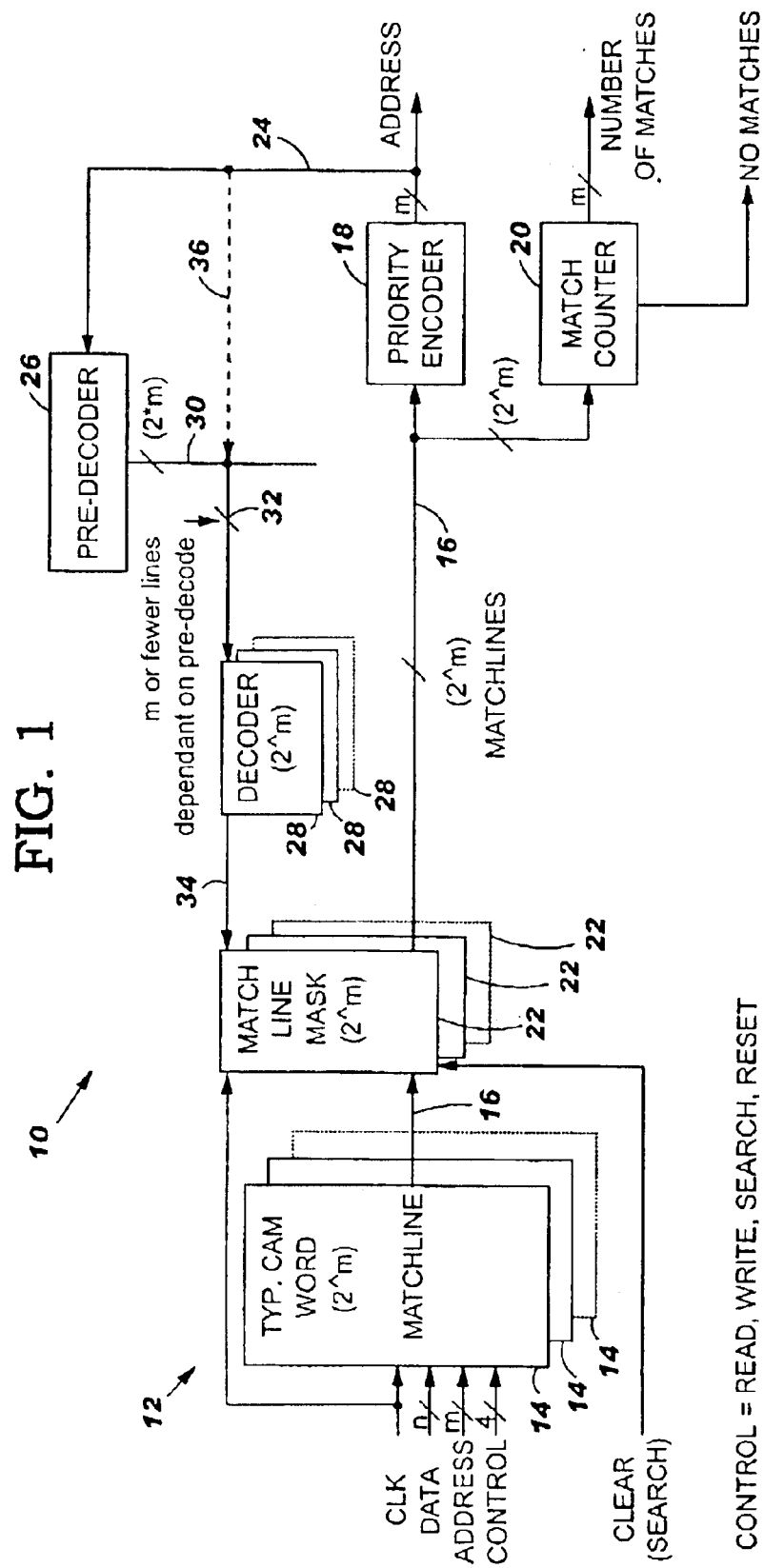
FIG. 1 illustrates a circuit for reading out multiple match hits from a CAM in accordance with the present invention, wherein each matchline is input into a matchline mask unit.

It should be noted that the drawings are merely schematic representations, not intended to portray specific parameters of the invention. The drawings are intended to depict only typical aspects of the invention, and therefore should not be considered as limiting the scope of the invention. In the drawings, like numbering represents like elements.

DETAILED DESCRIPTION OF THE INVENTION

The present invention addresses the above-mentioned problems, as well as others, by providing a circuit for reading out multiple match hits from a CAM. An embodiment of a CAM readout circuit 10 in accordance with the present invention is illustrated in FIG. 1.

The CAM readout circuit 10 shown in FIG. 1 includes a CAM 12 of a type known in the art. The CAM 12 is addressed by m bits (ADDRESS) and includes $2^m$ CAM words 14 each containing n data bits (DATA). A matchline 16 is associated with each CAM word 14 for a total of $2^m$ matchlines 16. The voltage level on each matchline 16 indicates whether there is a corresponding matching entry for that address in the CAM 12. For example, a high voltage level on a matchline may indicate a matching entry in the CAM word that is associated with the matchline, while a low voltage level on the matchline may indicate a no match condition.

A clock (CLK) signal is input into the CAM 12 and is input into each of the $2^m$ match line masks 22. A control signal (CONTROL) is input to the CAM 12. The CONTROL signal provides instructions to the CAM 12, such as READ, WRITE, SEARCH, and RESET, in a manner known in the art.

Each of the $2^m$ matchlines 16 is output to a corresponding one of $2^m$ matchline mask units 22. Each matchline mask unit 22 is configured to selectively "mask" its associated matchline 16 by pulling the matchline to a low voltage level (i.e., indicating a "no match" condition). In addition, after passing through the $2^m$ matchline mask units 22, the $2^m$ matchlines 16 are input to a priority encoder 18 and a match counter 20. As will be presented in greater detail below, each matchline mask unit 22 operates to "mask" its corresponding matchline 16 from the priority encoder 18 after the address of the matching CAM word associated with the matchline 16 has been encoded by the priority encoder 18. The match counter 20 dynamically outputs the number of matches that are currently present on the $2^m$ matchlines 16. If there are no matches, the match counter 20 outputs a NO MATCHES flag.

Based on the voltage level on each of the $2^m$ matchlines 16, the priority encoder 18 selects one of the matchlines 16 that indicates a match. The priority encoder 18 then encodes the address of the matching CAM word 14 that is associated with the selected matchline 16 on a first clock cycle.

As known in the art, such a priority encoder 18 commonly includes internal logic that examines each of the matchlines 16, determines which matchlines 16 indicate a match, sorts the matchlines that indicate a match according to a priority scheme, and encodes the highest priority match (e.g., the matchline 16 corresponding to the highest or lowest CAM word 14 address) into an m-bit address 24. This process is repeated for each match in accordance with its priority.

The m-bit address 24 output by the priority encoder 18 is typically used to select an addressable location in a secondary memory. In addition, in accordance with the present invention, the m-bit address 24 output by the priority encoder 18 is used to mask off the matchline 16 corresponding to the m-bit address 24, such that it no longer indicates a match. This is accomplished using a pre-decoder 26, $2^m$ decoders 28, and the $2^m$ matchline mask units 22. Each of the $2^m$ decoders 28 is associated with one of the $2^m$ matchline masks 22, which is associated with a specific matchline 16 and CAM word 14 in the CAM 12.

The priority encoder 18 outputs the m-bit address 24 to the pre-decoder 26. The pre-decoder 26 receives the m-bit address 24 and outputs decoder 28 selection data on 2*m lines 30. Each of the $2^m$ decoders 28 is coupled to m or fewer lines 32 of the 2*m lines 30. The decoder 28 that is associated with the currently selected matchline 16 is selected by the decoder selection data on the lines 32. The selected decoder 28 outputs a MASK OFF signal 34 to its associated matchline mask 22. As known in the art, the use of such a pre-decoder 26 helps to reduce the circuit complexity of the $2^m$ decoders 28 and reduces the number of routing wires. In an alternate embodiment of the present invention, the priority encoder 18 may output the m-bit address 24 directly to the $2^m$ decoders 28 as indicated by the dashed line 36, thereby obviating the need for the pre-decoder 26.

Upon receipt of the MASK OFF signal 34, and during the next clock cycle, the selected matchline mask 22 masks off its matchline 16 from the priority encoder 18 (i.e., the matchline 16 is set to a no-match state). To this extent, assuming that M match signals were initially present on the $2^m$ matchlines 16, the priority encoder 18 and the match counter 20 now only see M-1 match signals on the $2^m$ matchlines 16. The output of the match counter 20, therefore, now indicates that M-1 matches are present on the $2^m$ matchlines 16. On the next clock cycle, the priority encoder 18 encodes one of the remaining M-1 matchlines 16 that indicates a match in priority order and outputs the m-bit address 24 corresponding to the selected matchline 16. Thereafter, on the next clock cycle, the matchline 16 corresponding to the m-bit address 24 currently output by the priority encoder 18 is masked off as detailed above. This process is repeated until all matching addresses have been output by the priority encoder 18 and all of the matchlines 16 that originally indicated a match have been masked off. At this point in the process, the match counter 20 outputs a NO MATCHES flag indicating that there are no remaining matches. Upon completion of the CAM 12 search, a CLEAR signal is used to reset each of the $2^m$ matchline masks 22 so that none of the $2^m$ matchline masks 22 is masked off.

One of the $2^m$ matchline masks 22 is illustrated in greater detail in FIG. 2. The truth table for the matchline mask 22 is also shown in FIG. 2. As depicted, the matchline mask 22 comprises a flip-flop 40, PFET transistors 42 and 44, and NFET transistor 46.

The MASK OFF signal 34, which is provided by an associated decoder 28 via the PFET transistor 42, is input to the SET input of the flip-flop 40. The gate of the PFET transistor 42 is controlled by the CLK (bar) signal. The Z-output of the flip-flop 40 is input to the gate of NFET transistor 46, which is tied to ground. The Z-output of the flip-flop 40 is also input to the gate of the PFET transistor 44.

Initially, prior to a CAM 12 search, each of the $2^m$ matchline masks 22 is cleared. Referring to FIG. 2, this is achieved by providing a high CLR signal to the CLEAR input of the flip-flop 40. This sets the Z-output of the flip-flop 40 low. The low Z-output signal turns off the NFET transistor 46 and turns on the PFET transistor 44, such that the matchline signal 16 passes through the matchline mask 22 (i.e., MATCHLINE N=MATCHLINE OUT).

After completion of the CAM 12 search, and assuming that the matchline 16 indicates a match and has been selected by the priority encoder 18 (FIG. 1), the decoder 28 associated with the matchline mask 22 outputs a MASK OFF signal 34. The MASK OFF signal 34 is input to the SET input of the flip-flop 40 through the PFET transistor 42. When the clock CLK signal subsequently goes high (i.e., CLK (BAR) goes low), the PFET transistor 42 is turned on and the flip-flop 40 is set, thereby producing a high signal at the Z-output of the flip-flop 40. This turns on the NFET transistor 46, switches off the PFET transistor 44, and pulls the MATCHLINE OUT signal low (i.e., no match). Accordingly, the priority encoder 18 no longer "sees" a match signal on the matchline 16. The match counter 20 is then dynamically refreshed, and this process is repeated until all matching addresses have been output by the priority encoder 18.

The CAM readout circuit 10 of the present invention provides a much lower minimum cycle time between address reads than other systems known in the art (e.g., such as the system disclosed in U.S. Pat. No. 6,118,682 to Martin). Unlike the system in the patent to Martin, the minimum cycle time provided by the present invention does not increase dramatically as the size of the CAM 12 increases. In particular, the minimum cycle time (i.e., the clock speed limit) of the CAM readout circuit 10 of the present invention is given by:

$$\min\_cycle = (2 + (2 * \#of\ address\_bits)) * gate\ delay$$

Accordingly, for a 16-word CAM (4 address bits), the minimum cycle time (gate delays) is 10 (compared to 16 in Martin), while for a 1024-word CAM (10 address bits), the minimum cycle time (gate delays) is 22 (compared to 1024 in Martin).

The minimum cycle time of the CAM readout circuit 10 of the present invention can be generalized as follows:

$$\min\_cycle = (A + (B * \#address\_bits)) * gate\_delay$$

wherein (A+(B*#address_bits)) is the number of gates a signal passes thru on its way to one of the matchline masks 16. The term B*#address_bits is the gate delay through the priority encoder 18, and is related to the number of address bits m. In the simplest case, B is equal to 2. The term A can be broken into two components, A1 and A2, wherein A1 is the gate delay through the pre-decoder 26, and A2 is the gate delay through a decoder 28. In the simplest case, A1 and A2 are equal to 1. This is a generalization because there are many ways to design the pre-decoder 26 and a decoder 28.

The foregoing description of various aspects of the invention has been presented for purposes of illustration and description. It is not intended to be exhaustive or to limit the invention to the precise form disclosed, and obviously, many modifications and variations are possible. For example, the matchline mask unit 22 may be implemented using circuitry other than that illustrated in FIG. 2. Such modifications and variations that may be apparent to a person skilled in the art are intended to be included within the scope of the invention as defined by the accompanying claims.

What is claimed is:

1. An apparatus for reading out multiple match hits from a content addressable memory (CAM), comprising:
   a priority encoder for receiving a plurality of matchlines from a CAM and for sequentially encoding addresses of the CAM that are associated with the matchlines that indicate a match; and
   a matchline mask system for selectively masking off a matchline that indicates a match from the priority encoder after the address associated with that matchline is encoded by the priority encoder.

2. The apparatus according to claim 1, wherein the matchline mask system comprises:
   a plurality of matchline mask units, wherein each matchline passes through a corresponding one of the matchline mask units.

3. The apparatus according to claim 2, further comprising:
   a decoder system for selecting the matchline mask unit corresponding to the encoded address output by the priority encoder.

4. The apparatus according to claim 3, wherein the decoder system comprises:
   a plurality of decoders, wherein each decoder is associated with one of the matchline mask units.

5. The apparatus according to claim 3, wherein each matchline mask unit comprises:
   a flip-flop having an output and a set input for receiving a mask off signal from the decoder system, wherein, in response to the mask off signal, the output of the flip-flop sets the matchline associated with the matchline mask unit to a no-match condition.

6. The apparatus according to claim 5, wherein the mask off signal is provided to the set input of the flip-flop through a FET, and wherein a gate of the FET is controlled by a clock signal.

7. The apparatus according to claim 5, wherein the matchline passes through a FET, and wherein the output of the flip-flop controls the gate of the FET to disconnect the matchline entering the matchline mask unit from the matchline exiting the matchline mask unit in response to the mask off signal.

8. The apparatus according to claim 5, wherein the output of the flip flop controls the gate of a FET that is connected to the matchline and a voltage level indicative of a no-match condition, and wherein the matchline is set to the voltage level in response to the mask off signal.

9. The apparatus according to claim 1, wherein the matchline mask system sequentially masks off the matchlines until none of the matchlines indicates a match.

10. An apparatus for masking matchlines of a content addressable memory (CAM), comprising:
    a priority encoder for sequentially encoding addresses of the CAM that are associated with the matchlines that indicate a match;
    a plurality of matchline mask units, wherein each matchline of the CAM passes through a respective one of the matchline mask units, and wherein each matchline mask unit is configured to mask its associated matchline from the priority encoder; and
    a decoder system for sequentially masking each matchline that indicates a match from the priority encoder using the matchline's respective matchline mask unit.

11. The apparatus according to claim 10, wherein the decoder system selects a matchline to be masked in response to the priority encoder encoding a CAM address that is associated with the matchline.

12. The apparatus according to claim 10, wherein each matchline mask unit comprises:
    a flip-flop having an output and a set input for receiving a mask off signal from the decoder system, wherein, in response to the mask off signal, the output of the flip-flop sets the matchline associated with the matchline mask unit to a no-match condition.

13. The apparatus according to claim 12, wherein the mask off signal is provided to the set input of the flip-flop through a FET, and wherein a gate of the FET is controlled by a clock signal.

14. The apparatus according to claim 12, wherein the matchline passes through a FET, and wherein the output of the flip-flop controls the gate of the FET to disconnect the matchline entering the matchline mask unit from the matchline exiting the matchline mask unit in response to the mask off signal.

15. The apparatus according to claim 12, wherein the output of the flip flop controls the gate of a FET that is connected to the matchline and a voltage level indicative of a no-match condition, and wherein the matchline is set to the voltage level in response to the mask off signal.

16. A method for reading out multiple match hits from a content addressable memory (CAM), comprising:
    receiving a plurality of matchlines from a CAM;
    determining and prioritizing the matchlines that indicate a match;
    sequentially encoding the addresses of the CAM that are associated with the matchlines that indicate a match; and
    selectively masking off a matchline that indicates a match after the address associated with that matchline has been encoded.

17. The method of claim 16, wherein the plurality of matchlines initially indicate a total of M matches, and wherein the total number of matches is reduced by 1 each time an address is encoded.

18. The method of claim 16, wherein the masking reduces a minimum cycle time between the encoding of addresses in the CAM.

19. An apparatus for reading out multiple match hits from a content addressable memory (CAM), comprising:

a priority encoder for receiving a plurality of matchlines from a CAM and for sequentially encoding addresses of the CAM that are associated with the matchlines that indicate a match;

a matchline mask system for selectively masking off a matchline that indicates a match from the priority encoder after the address associated with that matchline is encoded by the priority encoder; and a match counter for providing a current match count and a no match flag.

* * * * *